(12) United States Patent
Hsu

(10) Patent No.: US 7,812,625 B2
(45) Date of Patent: Oct. 12, 2010

(54) CHIP TEST APPARATUS AND PROBE CARD CIRCUIT

(75) Inventor: Chia-Chi Hsu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 12/122,720

(22) Filed: May 19, 2008

(65) Prior Publication Data

US 2009/0224779 A1 Sep. 10, 2009

(30) Foreign Application Priority Data

Mar. 5, 2008 (TW) .............................. 97107731 A

(51) Int. Cl.
*G01R 31/02* (2006.01)
(52) U.S. Cl. ..................................................... 324/754
(58) Field of Classification Search .............. 324/158.1, 324/754–765
See application file for complete search history.

(56) References Cited

U.S. PATENT DOCUMENTS

| 5,550,480 | A | * | 8/1996 | Nelson et al. | ................ | 324/754 |
| 6,339,338 | B1 | * | 1/2002 | Eldridge et al. | ............. | 324/765 |
| 6,445,207 | B1 | * | 9/2002 | Kamimura | ................... | 324/765 |
| 7,245,120 | B2 | * | 7/2007 | Eldridge et al. | .......... | 324/158.1 |
| 7,262,613 | B2 | * | 8/2007 | Komatsu et al. | ............ | 324/754 |

* cited by examiner

*Primary Examiner*—Ha Tran T Nguyen
*Assistant Examiner*—Joshua Benitez
(74) *Attorney, Agent, or Firm*—Jianq Chyun IP Office

(57) ABSTRACT

A circuit in probe card, which includes a signal line, a detection probe and a plurality of switch modules. A plurality of test response signals form a plurality of chips to be tested are transmitted on the signal line. The detection probe is coupled to the signal line for receiving the test response signals from the tested chips. In addition, each of the switch modules is respectively coupled to the signal line and the probes to selectively transmit the test response signals from the chips to the signal line such that the chips are able to be tested without disruption caused by an electrical short.

4 Claims, 2 Drawing Sheets

CHIP TEST APPARATUS AND PROBE CARD CIRCUIT

CROSS-REFERENCE TO RELATED APPLICATION

This application claims the priority benefit of Taiwan application serial no. 97107731, filed on Mar. 5, 2008. The entirety of the above-mentioned patent application is hereby incorporated by reference herein and made a part of specification.

BACKGROUND OF THE INVENTION

1. Field of the Invention

The present invention generally relates to a probe card circuit, and more particularly, to a probe card circuit having a debug function.

2. Description of Related Art

In the current highly-developed technical information society, semiconductor devices take up an important position. However, the semiconductor practitioners have to carry out tests repetitiously or add circuits for testing product quality during the fabrication of semiconductor devices or integrated circuits in order to achieve better quality of the products.

FIG. 1 is a circuit diagram of a conventional chip test apparatus. Referring to FIG. 1, the conventional chip test apparatus may test a plurality of tested chips 102, 104, 106, 108 on a wafer. The conventional test apparatus includes a test unit 110 and a probe card 112. The test unit 110 is coupled to the probe card 112 through a plurality of power lines 122, 124, 126, 128 and a signal line 130. The power lines 122, 124, 126, 128 are used for transmitting a test power VDD, and the signal line is used for transmitting a test response signal Vt.

The conventional probe card comprises a plurality of probes. Some of the probes 142, 144, 146, 148 are respectively coupled to the power lines 122, 124, 126, 128, and coupled to the tested chips 102, 104, 106, 108, so as to provide the test power VDD to the tested chips 102, 104, 106, 108. Other probes 152, 154, 156, 158 on the probe card are respectively coupled to a test terminal of the tested chips 102, 104, 106, 108. Thus, when the tested chips 102, 104, 106, 108 generate the test response signal Vt after receiving the test power VDD, the probe card 112 receives the test response signal Vt output by the tested chips 102, 104, 106, 108 through the probes 152, 154, 156, 158.

However, in the conventional test apparatus, if any one of the tested chips 102, 104, 106, 108 is damaged, a short circuit phenomenon may occur. For example, when the tested chip 104 is damaged, the probe 154 may be short-circuited. At this time, the test unit 110 cannot effectively receive the test response signal Vt sent back by the other probes 152, 156, 158. In other words, as long as one of the chips to be tested by the conventional test apparatus is damaged resulting in a short circuit, the test on other chips cannot proceed, and thus those chips will be discarded.

SUMMARY OF THE INVENTION

Accordingly, the present invention is directed to a circuit in a probe card and a chip test apparatus, capable of proceeding testing other chips when one of the tested chips is short-circuited.

The present invention provides a circuit in probe card, which includes a signal line, a detection probe and a plurality of switch modules. A plurality of test response signals form a plurality of chips to be tested are transmitted on the signal line. The detection probe is coupled to the signal line for receiving the test response signals from the tested chips. In addition, each of the switch modules is respectively coupled to the signal line and the probes to selectively transmit the test response signals from the chips to the signal line such that the chips are able to be tested without disruption caused by an electrical short.

In an embodiment of the present invention, each of the switch modules may further include a transistor having a first source/drain end coupled to the test unit, a second source/drain end for receiving the test response signal, and a gate end for receiving a test power. In addition, the switch module may further include an amplifier with a gain value. The amplifier has an input end for receiving the test power and an output end coupled to the gate end of the transistor.

Since the switch module determines whether or not to float the probes used for receiving the test response signal according to the status of the test power, when the test apparatus of the present invention is employed to test a plurality of tested chips at the same time and one of the tested chips is damaged resulting in a short circuit, the test apparatus of the present invention may still proceed testing the remaining chips.

In order to make the aforementioned and other objectives, features, and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
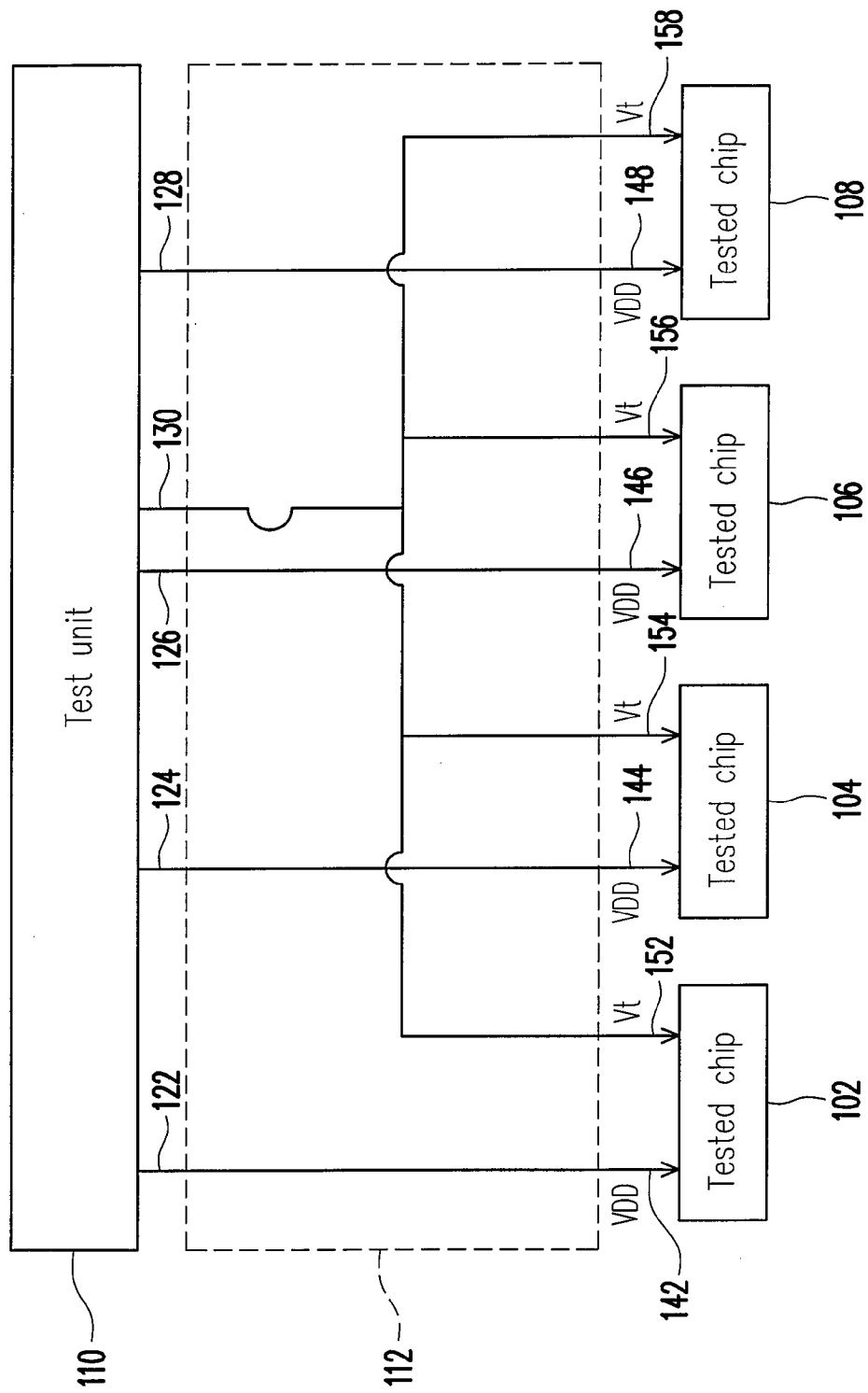
FIG. 1 is a circuit diagram of a conventional chip test apparatus.

Reference will now be made in detail to the present embodiments of the invention, examples of which are illustrated in the accompanying drawings. Wherever possible, the same reference numbers are used in the drawings and the description to refer to the same or like parts.

Figure 2:
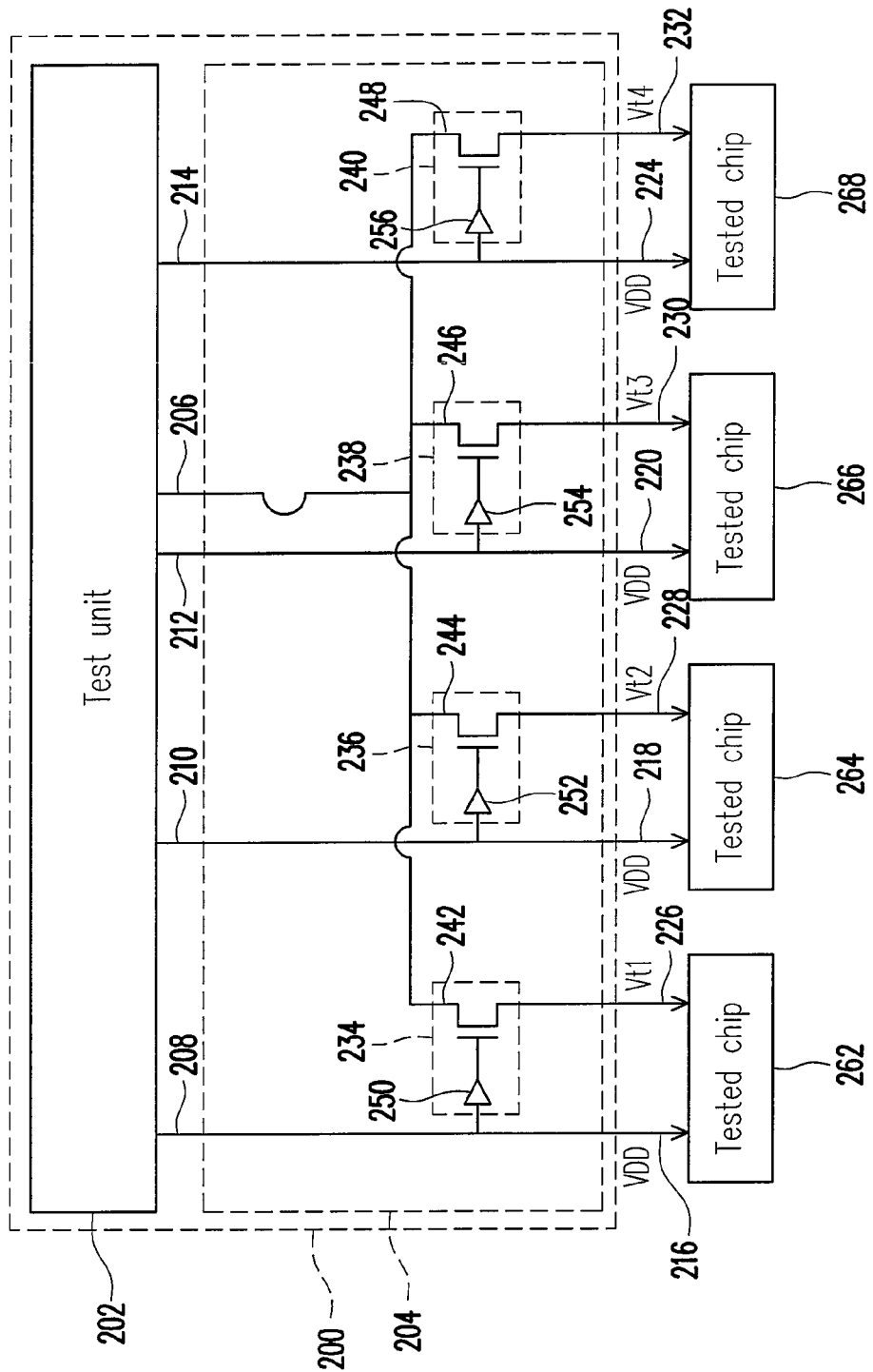
FIG. 2 is a circuit diagram of a chip test apparatus according to an embodiment of the present invention.

FIG. 2 is a circuit diagram of a chip test apparatus according to an embodiment of the present invention. Referring to FIG. 2, the chip test apparatus 200 provided by this embodiment may test a plurality of chips, for example, 262, 264, 266, 268 on a wafer at the same time. In this embodiment, the chip test apparatus 200 provides a test power VDD to the tested chips 262, 264, 266, 268. Thus, the tested chips 262, 264, 266, 268 respectively generate test response signals Vt1, Vt2, Vt3, Vt4 to the chip test apparatus 200 after receiving the test power VDD.

The chip test apparatus 200 includes a test unit 202 and a plurality of probe cards as probe card 204. The test unit 202 is coupled to the probe card 204 through at least a signal line 206, and the signal line 206 is used for transmitting the test response signals Vt1, Vt2, Vt3, Vt4 generated by the tested chips 262, 264, 266, 268. In addition, the test apparatus 200 may further include power lines, for example, 208, 210, 212, 214, which are also coupled to the test unit 200 and the probe card 204. Thus, the test unit 202 may transmit the test power VDD to the probe card 204 through the power lines 208, 210, 212, 214.

In addition, the probe card 204 may have a plurality of probes, for example, power probes 216, 218, 220, 224, and detection probes 226, 228, 230, 232. The power probes 216, 218, 220, 224 are respectively coupled to a plurality of power terminals of the tested chips 262, 264, 266, 268, and coupled to the power lines 208, 210, 212, 214. Thus, the test power VDD is transmitted to the tested chips 262, 264, 266, 268 through the probe card 204. Further, the detection probes 226, 228, 230, 232 are used to be coupled to a plurality of test terminals of the tested chips 262, 264, 266, 268 respectively. As such, through the detection probes 226, 228, 230, 232, the probe card 204 may receive the test response signals Vt1, Vt2, Vt3, Vt4 respectively generated from the test terminal of the tested chips 262, 264, 266, 268 according to the test power VDD.

Particularly, in the probe card 204, a plurality of switch modules 234, 236, 238, 240 may be respectively coupled to the detection probes 226, 228, 230, 232 and the signal line 206. In this embodiment, the switch modules 234, 236, 238, 240 determine whether or not to switch on according to the status of the test power VDD.

In some embodiments, each of the switch modules 234, 236, 238, 240 has a transistor, for example, 242, 244, 246, 248. The transistors 242, 244, 246, 248 may be implemented by NMOS transistors having a first source/drain end coupled to the signal line 206 and a second source/drain end respectively coupled to the corresponding detection probes 226, 228, 230, 232. Further, a gate end of the transistors 242, 244, 246, 248 may be used for receiving the test power VDD.

In other alternative embodiments, each of the switch modules 234, 236, 238, 240 may further include an amplifier 250, 252, 254, 256 respectively. The amplifiers 250, 252, 254, 256 are with a gain value, for example, 2. In addition, an input end of the amplifiers 250, 252, 254, 256 is coupled to the power lines 208, 210, 212, 214 and an output end is coupled to the gate end of the transistors 242, 244, 246, 248. The response of the switch modules 234, 236, 238, 240 can be speeded up through the amplifiers 250, 252, 254, 256.

An example of the operation of the chip test apparatus 200 of this embodiment in the situation that the tested chip 264 is open circuit is illustrated below. If the tested chip 264 has defects and an open circuit event was occurred in power line 210, the test unit 200 stops supplying the test power VDD to the tested chip 264. In other words, the voltage level of the power line 210 is substantially 0. At this time, the potential of the gate end of the transistor 244 is dropped to a lower level, thus the transistor 244 is concurrently turned off. Here, the state of the detection probe 228 is regarded as floating.

In addition, the other power lines 208, 212, 214 may remain at the level of VDD, such that the transistors 242, 246, 248 remain in on state. Therefore, the test response signals Vt1, Vt3, Vt4 output by the tested chips 262, 266, 268 may be sent back to the test unit 202 through the detection probes 226, 230, 232 and the signal line 206, so as to complete the test.

In view of the above, the probe card provided by the present invention has a plurality of switching circuits for determining whether or not to float the detection probes respectively coupled thereto according to the status of the test power. Therefore, even if one of the tested chips is damaged resulting in a short circuit, the test apparatus provided by the present invention may still proceed testing the other chips.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit in a probe card comprising a signal line coupled between a test unit and a plurality of chips to be tested for transmitting a plurality of test response signals from the plurality of chips to the test unit, and a plurality of detection probes respectively coupled to the signal line for receiving the test response signals, wherein the improvement comprises:
   a plurality of switch modules electrically connected to the signal line and the chips to be tested so as to selectively transmit the test response signals from the chips to the test unit through the signal line, each of the switch modules having a first end and a second end, the first end coupled to the test unit through the signal line, the second end coupled to the corresponding chip through the corresponding detection probe, each of the switch modules transmitting the corresponding test response signal from the corresponding chip to the test unit, and each of the switch modules determining whether to float the detection probe coupled to the corresponding switch module according to a status of a test power such that the chips are able to be tested without disruption caused by an electrical short.

2. The circuit according to claim 1, wherein each of the plurality switch modules comprises a transistor having a first source/drain end coupled to the signal line, a second source/drain end coupled to the plurality of detection probes, and a gate end for receiving a test power such that the switch modules is controlled based on the state of the test chips and selectively turned on by the test power.

3. The circuit according to claim 2, wherein each of the plurality of switch modules further comprises an amplifier with a gain value and the amplifier comprises an input end coupled to the power line and an output end coupled to the gate end of the transistor.

4. The circuit according to claim 1, wherein the transistor is an NMOS transistor.

* * * * *